(12) United States Patent
Park

(10) Patent No.: US 7,449,740 B2
(45) Date of Patent: Nov. 11, 2008

(54) SEMICONDUCTOR MEMORY DEVICE HAVING CAPACITORS AND METHOD FOR FORMING THE SAME

(75) Inventor: Je-Min Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 371 days.

(21) Appl. No.: 11/105,728

(22) Filed: Apr. 13, 2005

(65) Prior Publication Data

US 2005/0227436 A1    Oct. 13, 2005

(30) Foreign Application Priority Data

Apr. 13, 2004    (KR) .................. 10-2004-0025300

(51) Int. Cl.
*H01L 27/108*    (2006.01)
(52) U.S. Cl. ............... 257/300; 257/296; 257/309; 257/306; 257/E27.005; 257/E27.115; 257/E27.116; 257/E29.001; 438/14
(58) Field of Classification Search ........... 257/300, 257/296, 309, 306, E27.005, E27.115, E27.116, 257/E29.001; 438/14
See application file for complete search history.

(56) References Cited

U.S. PATENT DOCUMENTS

| | | | | |
|---|---|---|---|---|
| 5,017,514 A | * | 5/1991 | Nishimoto | ......... 438/14 |
| 5,457,334 A | * | 10/1995 | Nishimoto | ......... 257/306 |
| 6,011,286 A | * | 1/2000 | Wu | ......... 257/309 |
| 6,279,147 B1 | | 8/2001 | Buynoski et al. | |
| 6,319,791 B1 | | 11/2001 | Ando | |
| 6,586,308 B2 | | 7/2003 | Kling et al. | |

* cited by examiner

*Primary Examiner*—Bradley W. Baumeister
*Assistant Examiner*—Tucker Wright
(74) *Attorney, Agent, or Firm*—Marger Johnson & McCollom, P.C.

(57) ABSTRACT

A semiconductor substrate has a cell region and a peripheral circuit region surrounding the cell region. In the cell region a plurality of lower electrodes are connected to a conductive region of the semiconductor substrate, and are arrayed along row and column directions. A dielectric layer is formed on the plurality of lower electrodes. An upper electrode is formed on the dielectric layer, entirely covering the cell region, and is formed extending to a portion of the peripheral circuit region that has a step coverage lower by a height of the lower electrode than the cell region. An edge of the upper electrode has square-shaped projections that are distanced from each other at a uniform interval and are repetitively arrayed. With the described structure, pattern defects can be sensed and controlled, preventing and substantially reducing process defect.

5 Claims, 3 Drawing Sheets

SEMICONDUCTOR MEMORY DEVICE HAVING CAPACITORS AND METHOD FOR FORMING THE SAME

CROSS REFERENCE TO RELATED APPLICATIONS

This application claims priority from Korean Patent Application No. 2004-25300, filed on 13 Apr. 2004, the content of which is hereby incorporated by reference for all purposes.

BACKGROUND OF THE INVENTION

1. Field of the Invention

This disclosure relates to semiconductor memory devices, and more particularly, to a semiconductor memory device having capacitors, and a method of forming the same.

2. Description of the Related Art

In semiconductor memory devices such as DRAM (Dynamic Random Access Memory) devices, the device characteristics of a unit cell that includes a capacitor is heavily influenced by the capacitance of the capacitor. Thus, efforts have been made to increase the capacitance of the capacitor. Such efforts have included increasing an effective area of the capacitor, providing a dielectric layer positioned between both electrodes of the capacitor to become thin film, and forming a dielectric layer using high dielectric material.

Among the above methods, increasing the effective area of capacitor is perhaps the easiest, since the existing dielectric layer remains intact and processes that are well-known in the art are used.

Methods of increasing an effective area of the capacitor may be generally categorized into methods of constructing a lower electrode of a capacitor in a three-dimensional structure such as a pin, cylinder, or trench, methods of growing a HSG (Hemi-Spherical Grain) on a lower electrode, and methods of increasing the height of the lower electrode.

When a critical dimension (CD) between lower electrodes must be ensured, methods of growing HSG may occasionally cause a bridge between lower electrodes when a HSG is detached. In other words, the HSG growing method is generally difficult to apply to semiconductor devices having stringent design rules. Hence, an increase of effective area of capacitor to increase a capacitance generally employs a method of three-dimensionally constructing a lower electrode and increasing height thereof.

In the meantime, as the demand for increasingly integrated semiconductor devices continues, higher capacitances and lower leakage current characteristics become a necessity. The current trend is therefore to replace semiconductor memory devices having capacitors with a polysilicon/dielectric layer/polysilicon structure with semiconductor memory devices having capacitors with a MIM (Metal-Insulator-Metal) structure.

When a material having a high dielectric constant, e.g., $Ta_2O_5$ or BST ($BaSrTiO_3$), is used as a capacitor dielectric layer, it becomes difficult to use a capacitor electrode made of a conventional polysilicon layer. That is, leakage currents generated by tunneling occur when a thickness of the dielectric layer is reduced. Hence, when a high-dielectric layer or ferroelectric layer is used for the dielectric layer, metal matter having a very high work-function is used for the capacitor electrode material.

The practice of forming an upper electrode with metal has tended to simplify the capacitor forming process. Previously, forming a polysilicon upper electrode in a cell region resulted in increased resistance in a peripheral circuit region since the polysilicon layer functions as a resistance element. However, when the upper electrodes are made of metal, a lower resistance in the peripheral circuit region is typically the result.

Generally, when defects occur in an upper electrode formation process due to a process condition error, the defects may not be detected. This is especially true when upper electrodes are formed of metal, which, as explained above, decreases the resistance in the peripheral circuit region. In this case, an entire upper electrode pattern may not be enough to measure in detail a CD as compared with a conventional polysilicon pattern. Thus, even though an abnormal pattern may be generated, the abnormality may be not sensed, and this causes process defects.

FIG. 1 is a layout diagram illustrating the shape of an upper electrode of a capacitor in a cell region and a peripheral circuit region of a semiconductor memory device according to an example of the conventional art.

Referring to FIG. 1, a capacitor lower electrode (not shown) is formed in a cell region 12, and a metal capacitor upper electrode 10 is formed on the capacitor lower electrode, the capacitor upper electrode extending into a portion of a peripheral circuit region 14. The edges of the capacitor upper electrode 10 in the peripheral circuit region 14 are essentially straight lines, the edges having no variation or pattern. The edges of the capacitor upper electrode 10 protrude into the peripheral circuit region 14 to connect with a metal contact (element 16 of FIG. 2) that is formed in a subsequent process.

The shape of the metal capacitor upper electrode 10 is generally the same as a polysilicon upper electrode. But, as was explained above, the occurrence of a defect in the upper electrode pattern may go undetected because a resistance is not formed in the peripheral circuit region. Furthermore, the width of the portion of the upper electrode 10 that extends into the peripheral circuit region 14 may not be controlled appropriately.

FIG. 2 is an electron microscope photograph that illustrates a defect that may be caused by the upper electrode pattern of FIG. 1.

As shown in FIG. 2, a flow effect is generated on an upper electrode pattern in a peripheral circuit region 14, and upper electrodes 10 separated by the peripheral circuit region 14 therebetween are connected with each other.

In this case, in a subsequent metal contact forming process, a contact hole for a metal contact cannot be properly formed by the upper electrode, thus causing process defects.

Embodiments of the invention address these and other disadvantages of the conventional art.

SUMMARY OF THE INVENTION

According to embodiments of the invention, defects in an upper electrode pattern may be sensed, preventing or substantially reducing process defects.

BRIEF DESCRIPTION OF THE DRAWINGS

The above and other features of exemplary embodiments of the invention will become readily apparent from the description that follows, with reference to the attached drawings that are briefly described below.

DETAILED DESCRIPTION OF THE INVENTION

Figure 1:
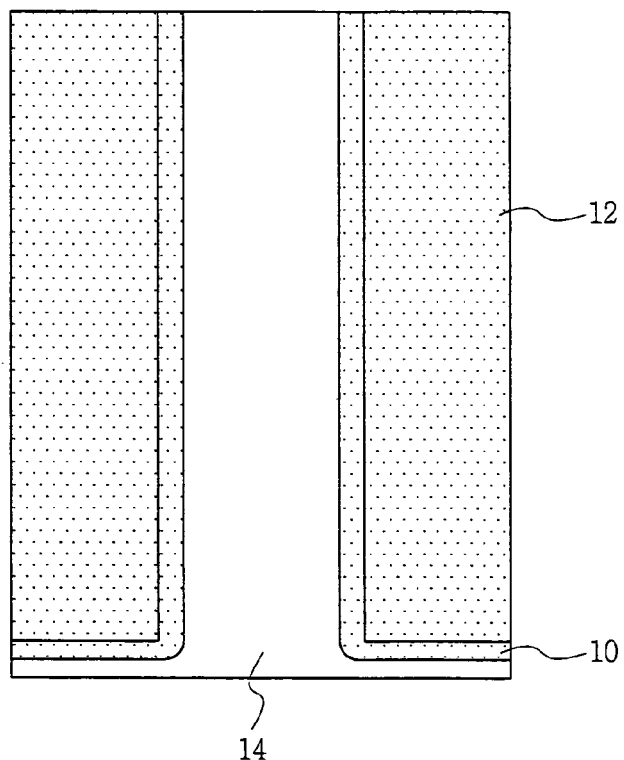
FIG. 1 is a layout diagram illustrating an upper electrode of a semiconductor memory device according to an example of the conventional art.

Exemplary embodiments of the invention are described more fully below with reference to FIGS. 3 to 5. However, the invention may be embodied in many different forms and should not be construed as being limited to the exemplary embodiments set forth herein. Rather, these exemplary embodiments are provided so that this disclosure is thorough and complete, and conveys the inventive concepts found in the exemplary embodiments to those skilled in the art.

A method of forming a semiconductor memory device having capacitors according to one exemplary embodiment of the invention is the same as a conventional case, except a process of forming a capacitor upper electrode.

First, a shallow trench isolator for isolation between devices is formed in a semiconductor substrate on which a cell region and a peripheral circuit region are defined. Then, on the semiconductor substrate, a lower structure of a transistor including source/drain and a gate, a word line and bit line, etc., is formed. Next, a lower insulation layer is formed on the semiconductor substrate, and then a plurality of contact plugs, which pierce a lower insulation layer and are in contact with an impurity region of a semiconductor substrate, are formed.

On the contact plugs and lower insulation layer, insulation material such as BPSG (Boron Phosphorus Silicate Glass), PSG (Phosphorus Silicate Glass), PE-TEOS (Plasma Enhanced-Tetra Ethyl Ortho Silicate) or HDP (High Density Plasma) oxide, is deposited, thus forming an insulation layer.

Subsequently, the insulation layer is partially etched, thus forming an insulation layer pattern to define a plurality of apertures for exposing the contact plugs and an upper part of the lower insulation layer on its periphery. If necessary, an etch stop layer may be first formed on the contact plugs and the lower insulation layer, and then the insulation layer is formed thereon. The etch stop layer is formed of, e.g., a nitride layer, which has an etch selectivity different from the insulation layer.

The insulation layer pattern is formed only in a cell region. After the insulation layer pattern is formed, and entirely thereon, a capacitor lower electrode conductive layer is formed with a thickness not to completely bury the apertures. The conductive layer may be formed of a single layer using one material or of multi layer using plural materials, selected from a group that is composed of Ru, Ir, Pt, $RuO_x$, $IrO_x$, $PtO_x$, amorphous silicon and polysilicon.

The lower electrode conductive layer may be formed by CVD (Chemical Vapor Deposition) or ALD (Atomic Layer Deposition) having a prominent step-coverage covering. In some cases, a seed layer is formed by PVD (Physical Vapor Deposition), and then a main layer may be formed by CVD or ALD. In other words, a combined PVD and CVD or combined PVD and ALD method may be used.

An insulation layer such as a sacrificial oxide layer, etc., for sufficiently burying apertures in which the lower electrode conductive layer is formed, and the lower electrode is separated by using a polarization process such as CMP, etc. A capacitor lower electrode, separated by the polarization process, is completed.

An insulation layer remaining in an inner side between the node-separated lower electrodes of the cell region, and an insulation layer remaining in a peripheral circuit region, are removed.

On a semiconductor substrate defined by the cell region and the peripheral circuit region surrounding the cell region by such processes, a plurality of capacitor lower electrodes electrically connected to contact plugs as a conductive region that is formed in a lower insulation layer are arrayed in row and column, thus forming a cell region. The cell region has a step coverage by a height of the capacitor lower electrode from the peripheral circuit region.

A dielectric layer is formed on the capacitor lower electrode. The dielectric layer may be formed of a single layer composed of a material selected from the group consisting of $TaO_x$, $AlO_x$, $TiO_x$, $SiO_2$, $Si_3N_4$ and $HfO_2$, etc., or the dielectric layer may be formed of multiple layers, each layer composed of a material selected from the aforementioned group. The dielectric layer may employ CVD or ALD having a prominent step-coverage covering, or may employ a combined PVD and CVD, or PVD and ALD method.

An upper electrode conductive layer is formed on the dielectric layer. The upper electrode conductive layer may be formed of a single layer using one material selected from a group that is composed of Ru, Ir, Pt, $RuO_x$, $IrO_x$, $PtO_x$, amorphous silicon and polysilicon, or may be formed of multiple layers, each layer composed of a material selected from the aforementioned group.

The upper electrode conductive layer may be formed through a CVD process, an ALD process, a combined PVD and CVD process, or a combined PVD and ALD process.

A photolithography and etching process is performed on the upper electrode conductive layer, thus forming a capacitor upper electrode. The upper electrode entirely covers a cell region on which a plurality of lower electrodes are formed, and are also extended to a portion of peripheral circuit region. The extension portion of the peripheral circuit region is provided to conveniently perform a metal contact process, etc. in subsequent processes.

Figure 3:
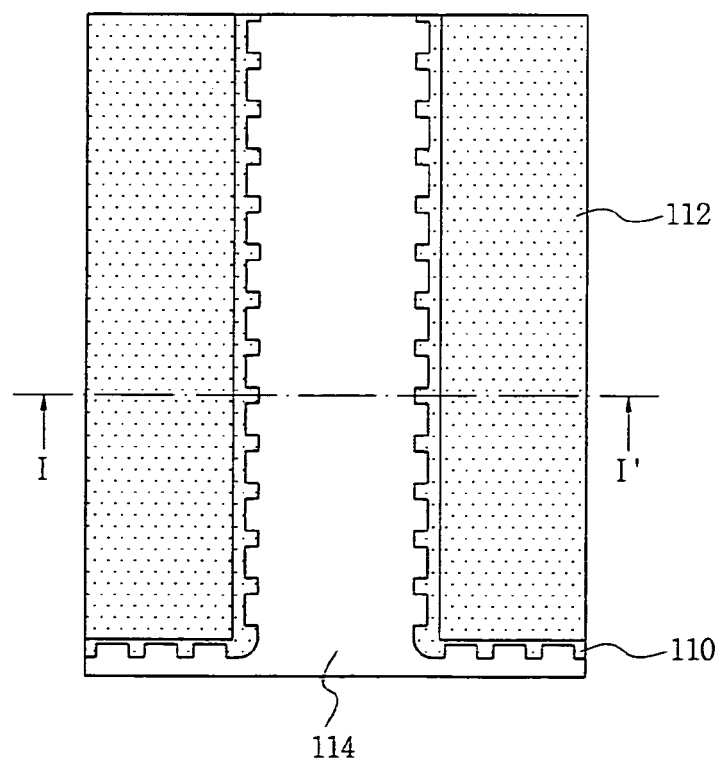
FIG. 3 is a layout diagram illustrating an upper electrode of a semiconductor memory device according to some embodiments of the invention.
Figure 2:
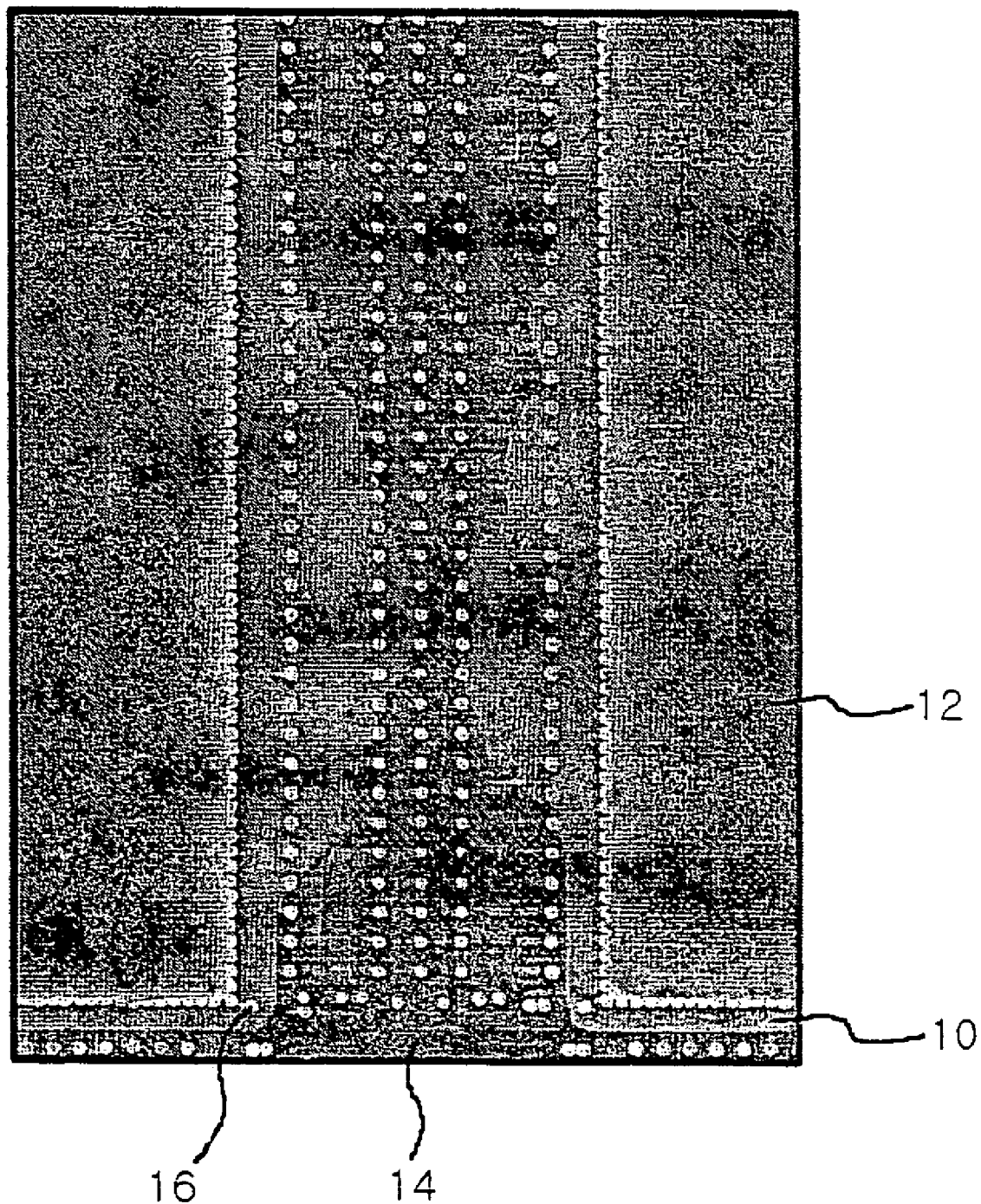
FIG. 2 is an electron microscope photograph that illustrates a defect that may be caused by the upper electrode pattern of FIG. 1.

FIG. 3 is a layout diagram illustrating an upper electrode of a semiconductor memory device according to some embodiments of the invention. As shown in FIG. 3, an upper electrode pattern 110 covers a cell region 112, and extends into a portion of a peripheral circuit region 114. The edges of the upper electrode pattern 110 in the peripheral circuit region 114 have square-shaped projections that are arrayed along the length and width of the upper electrode pattern at a uniformly spaced interval. The upper electrode pattern 110 is obtained by forming an etch mask pattern (not shown) on an upper electrode conductive layer, where the etch mask pattern has a structure that covers the cell region 112 and a portion of the peripheral circuit region 114, and where the etch mask pattern has an edge structure with square-shaped projections corresponding to the square-shaped projections of the electrode pattern 110. Using a conventional process, the etch mask pattern is used to etch the upper electrode conductive layer, thereby forming the upper electrode pattern 110.

In forming the upper electrode in such a structure, measurement of the CD of the electrode pattern is simple, and even though pattern defects may be generated, the defects can be detected in advance, preventing or substantially reducing process defects.

Figure 4:
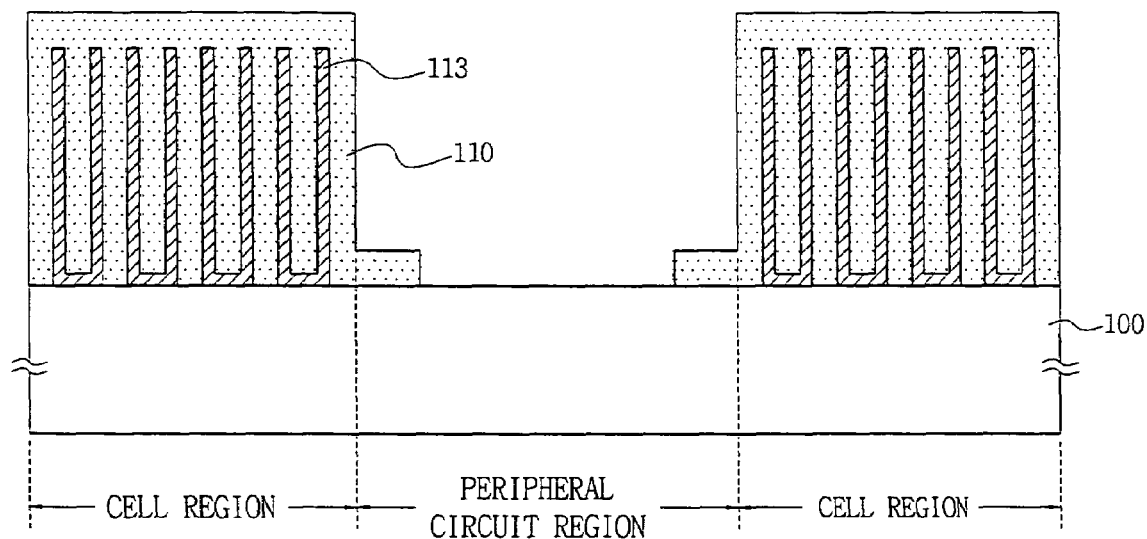
FIG. 4 is a sectional diagram that further illustrates the semiconductor device of FIG. 3, and is taken along the line I-I' of FIG. 3.

FIG. 4 is a sectional diagram that further illustrates the semiconductor device of FIG. 3, and is taken along the line I-I' of FIG. 3.

Referring to FIG. 4, capacitor lower electrodes 113 are formed in a cell region of a semiconductor substrate 100. A dielectric layer (not shown) is formed on the capacitor lower electrodes 113 in the cell region and extends into a portion of the peripheral circuit region. Next, an upper electrode 110 is formed on the dielectric layer, the upper electrode having a step coverage greater than a height of the lower electrode 113.

Figure 5:
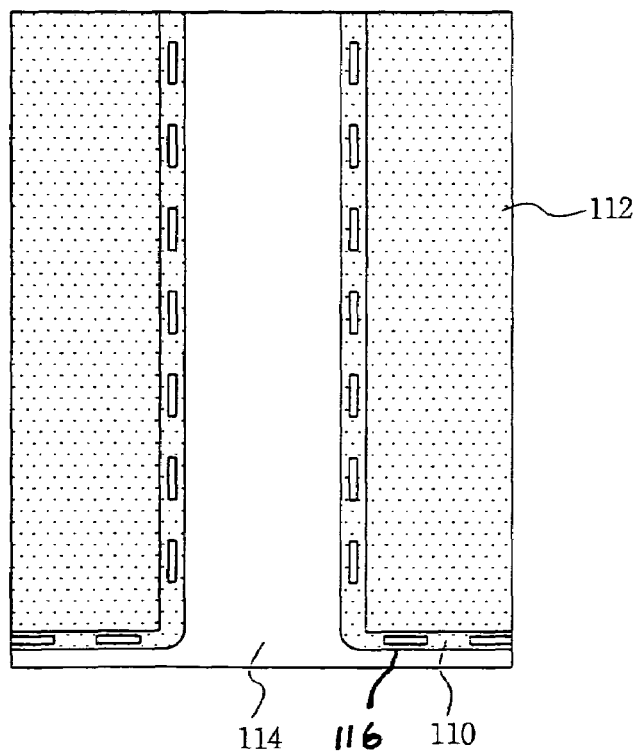
FIG. 5 is a layout diagram illustrating an upper electrode of a semiconductor memory device according to other embodiments of the invention.

FIG. 5 is a layout diagram illustrating an upper electrode of a semiconductor memory device according to other embodiments of the invention.

As shown in FIG. 5, an upper electrode 110 is disposed on a cell region of a semiconductor memory device and partially extends into a peripheral circuit region 114 of the semiconductor memory device. In the peripheral circuit region 114, a number of apertures 116 pierce through the upper electrode 110, and although not shown, also pierce through the dielectric layer that is disposed beneath the upper electrode 110. The apertures 116 are rectangular in shape, are the same size, and are uniformly spaced around the edge of the upper electrode 110. Other apertures of different sizes and shapes may be used, as long as the size and shape is sufficient to measure a CD.

The capacitor structure described above is suitable for use with semiconductor memory devices having, for instance, a MIM structure, a MIS (Metal-Insulator-Silicon) structure, or a SIS (Silicon-Insulator-Silicon) structure.

As described above, according to exemplary embodiments of the invention, pattern defects in a semiconductor memory device having capacitors may be sensed by a pattern change in an upper electrode of the capacitor. Thus, process defects may be prevented or substantially reduced by preventing pattern defects.

Embodiments of the invention may be practiced in many ways. What follows are exemplary, non-limiting descriptions of some of these embodiments.

According to an aspect of the invention, a semiconductor memory device having capacitors includes a semiconductor substrate having a cell region and a peripheral circuit region surrounding the cell region; a plurality of lower electrodes, which are connected to a conductive region of the semiconductor substrate in the cell region and which are arrayed along row direction and column direction; a dielectric layer formed on the plurality of lower electrodes; and an upper electrode, which is formed on the dielectric layer, entirely covering the cell region, and which is formed extending to a portion of the peripheral circuit region that has a step coverage lower by a height of the lower electrode than the cell region. Herewith, an edge of the upper electrode has a structure that projection parts of square shape are distanced with a uniform interval and are repetitively arrayed.

According to another aspect of the invention, a semiconductor memory device having capacitors includes a semiconductor substrate having a cell region and a peripheral circuit region surrounding the cell region; a plurality of lower electrodes, which are connected to a conductive region of the semiconductor substrate in the cell region and which are arrayed along row direction and column direction; a dielectric layer formed on the plurality of lower electrodes; and an upper electrode, which is formed on the dielectric layer, entirely covering the cell region, and which is formed extending to a portion of the peripheral circuit region that has a step coverage lower by a height of the lower electrode than the cell region. Herewith, the upper electrode formed on a portion of the peripheral circuit region has a structure that a plurality of apertures are distanced with a uniform interval and are repetitively arrayed, the plurality of apertures piercing through the upper electrode formed on a portion of the peripheral circuit region and the dielectric layer.

The aperture formed in the upper electrode may be shaped in a square type having a determined length and width for a sectional face thereof.

According to another aspect of the invention, a method of forming a semiconductor memory device having capacitors includes forming a plurality of lower electrodes arrayed along row and column directions, in a cell region of a semiconductor substrate that has the cell region and a peripheral circuit region surrounding the cell region; sequentially forming a dielectric layer and an upper electrode conductive layer on an entire face of the semiconductor substrate; and forming a mask pattern on the upper electrode conductive layer and forming an upper electrode through an etching process by using the mask pattern as an etch mask, where the mask pattern has a structure of covering the entire cell region and a portion of the peripheral circuit region, and an edge of the mask pattern has a structure that projection parts of a square shape are distanced with a uniform interval and are repetitively arrayed.

According to another aspect of the invention, a method of forming a semiconductor memory device having capacitors includes preparing a semiconductor substrate which has a cell region and a peripheral circuit region surrounding the cell region and on which a plurality of lower electrodes arrayed along row and column directions, are formed in the cell region; entirely forming a dielectric layer on the semiconductor substrate; and forming an upper electrode, on a region that has a determined distance from a boundary point with the cell region among the peripheral circuit region, and on the cell region, and simultaneously, forming a plurality of apertures, where the plurality of apertures have a determined length and width in an upper electrode formation region of the peripheral circuit region, pierce through the upper electrode and the dielectric layer, and are distanced with a uniform interval and are repetitively arrayed.

The aperture formed in the upper electrode may have a square shape with a determined length and width for a sectional face. The upper electrode conductive layer may be formed through a CVD or ALD. The upper electrode may be formed of a single layer using one material or of multi layer using plural materials, selected from a group that is composed of Ru, Ir, Pt, $RuO_x$, $IrO_x$, $PtO_x$, amorphous silicon, and polysilicon.

The structural and methodic configuration of the invention prevents or substantially reduce process defect by restraining pattern error in the upper electrode.

It will be apparent to those skilled in the art that modifications and variations can be made to the exemplary embodiments of the invention that were described above without deviating from the spirit or scope of the invention. Thus, it is intended that the invention cover any such modifications and variations provided that they come within the scope of the appended claims and their equivalents. Accordingly, these and other changes and modifications are seen to be within the true spirit and scope of the invention as defined by the appended claims.

I claim:

1. A semiconductor memory device comprising:
   a semiconductor substrate having a cell region and a peripheral circuit region surrounding the cell region;
   lower electrodes configured to function as lower electrodes for capacitors, the lower electrodes connected to a conductive region of the semiconductor substrate in the cell region, the lower electrodes arrayed along row and column directions;

a dielectric layer disposed on the lower electrodes; and an upper electrode disposed on the dielectric layer that covers the cell region and extends into the peripheral circuit region, a difference between a height of the upper electrode in the cell region and a height of the upper electrode in the peripheral circuit region equal to a height of the lower electrodes, an edge of the upper electrode in the peripheral circuit region having square-shaped projections that are uniformly arrayed along the edge of the upper electrode.

2. The device of claim 1, the lower electrodes composed of one or more layers, the one or more layers selected from the group consisting of a Ru layer, an Ir layer, a Pt layer, a $RuO_x$ layer, an $IrO_x$ layer, a $PtO_x$ layer, an amorphous silicon layer, and a polysilicon layer.

3. The device of claim 2, the dielectric layer composed of one or more layers, the one or more layers selected from the group consisting of a $TaO_x$ layer, an $AlO_x$ layer, a $TiO_x$ layer, a $SiO_2$ layer, a $Si_3N_4$ layer, and a $HfO_2$ layer.

4. The device of claim 3, the upper electrode composed of one or more layers, the one or more layers selected from the group consisting of a Ru layer, an Ir layer, a Pt layer, a $RuO_x$ layer, an $IrO_x$ layer, a $PtO_x$ layer, an amorphous silicon layer, and a polysilicon layer.

5. The device of claim 1, a top surface of a portion of the upper electrode in the cell region is above a top surface of a portion of the upper electrode in the peripheral circuit region.

* * * * *